United States Patent [19]

Baars

[11] 4,131,809

[45] Dec. 26, 1978

[54] SYMMETRICAL ARRANGEMENT FOR FORMING A VARIABLE ALTERNATING-CURRENT RESISTANCE

[75] Inventor: Nicolaas J. Baars, Eindhoven, Netherlands

[73] Assignee: U.S. Philips Corporation, New York, N.Y.

[21] Appl. No.: 847,221

[22] Filed: Oct. 31, 1977

Related U.S. Application Data

[63] Continuation of Ser. No. 586,052, Jun. 11, 1975.

[30] Foreign Application Priority Data

Jun. 17, 1974 [NL] Netherlands ..................... 7408034

[51] Int. Cl.² .......................................... H03K 1/14
[52] U.S. Cl. .................................... 307/303; 307/264; 307/296 A; 307/317 R; 357/36; 357/46; 357/51; 330/261; 330/285

[58] Field of Search ............... 307/264, 296, 303, 317, 307/321, 299 R, 256, 257, 259; 357/46, 35, 36; 330/29, 145

[56] References Cited

U.S. PATENT DOCUMENTS

| | | | |
|---|---|---|---|
| 2,910,634 | 10/1959 | Rutz | 307/299 |
| 3,010,033 | 11/1961 | Noyce | 307/299 |
| 3,509,446 | 4/1970 | Mullaly | 307/303 |
| 3,803,504 | 4/1974 | Takahashi | 330/29 |

*Primary Examiner*—John Zazworsky
*Assistant Examiner*—Marcus S. Rasco
*Attorney, Agent, or Firm*—Thomas A. Briody

[57] ABSTRACT

A symmetrical arrangement for forming a variable alternating-current resistance, which circuit arrangement comprises an elongate p,n junction or a ladder network of p,n junctions and resistors, the elongate p,n junction or the p,n junctions of the ladder network being connected between a source of control current and a source of bias current.

11 Claims, 11 Drawing Figures

SYMMETRICAL ARRANGEMENT FOR FORMING A VARIABLE ALTERNATING-CURRENT RESISTANCE

This is a continuation of application Ser. No. 586,052, filed June 11, 1975.

The invention relates to a symmetrical arrangement for forming a variable alternating-current resistance between a first and a second terminal, which arrangement comprises means for supplying a control current to the interconnection of two first pn junctions connected in the pass direction for the control current and connected in series between the said terminals.

Such arrangement is described, for example, in IEEE Transactions on Broadcast and Television Receivers, August 1972, pages 158–162, and is connected, for example, between the emitters of two transistors which together act as a differential amplifier. The variation of the control current varies the ac-resistance of the arrangement which serves for gain control of this amplifier. The value of the control current through the two pn junctions determines the differential resistance (small-signal alternating-current resistance) of the said pn junctions, and this differential resistance in turn determines the degree of negative signal feedback and hence the gain of the amplifier.

The differential resistance of a pn junction acts as a linear variable resistance for the signal currents as long as the ratio between the signal current and the control current remains small enough. With progressive control, however, the signal current increases and the control current decreases, so that the differential resistance of the pn junctions no longer is varied by the control current only but also is varied by the signal current. This gives rise to signal distortion, modulation distortion, cross-modulation and the like.

It is an object of the present invention to provide a symmetrical variable alternating-current resistance, especially for connection between the emitters of a differential-amplifier transistor pair or in other types of symmetrical circuits in which a variable alternating-current resistance is required, for example in modulators, demodulators, mixer stages and the like.

For this purpose the arrangement according to the invention is characterized in that each first pn junction is shunted by the series combination of a resistor and a second pn junction connected in the same pass direction and in that bias current conducting means are connected to each connection of resistor and second pn junction.

Owing to the voltage drops produced across the resistors by the bias current, when the control current increases from zero firstly the said second pn junctions will become conducting, the two linear resistors between the terminals becoming operative. With further increase of the control current the said first pn junctions will become conducting, thereby shunting the resistors. Owing to this step according to the invention, the linear resistance of the resistors remains included in the circuit between the two terminals during an important part of the control range, which considerably reduces signal distortion.

The abovedescribed step can be repeated so that a ladder network of resistors and pn junctions is produced all the resistors of which are successively short-circuited with increasing control current. Thus a circuit is obtained in which as long as possible the highest possible linear resistance is maintained in the signal circuit.

According to another aspect of the invention all the cathodes (anodes) of the said pn junctions together with the resistors connected between them can be combined in a first region of a semiconductor body whilst all the anodes (cathodes) can be combined in a second region of the semiconductor body. The symmetrical arrangement for constituting a variable alternating-current resistance between a first and a second terminal then is characterized by an elongate diode formed by a pn junction between first and second regions of opposite conductivity types in a semiconductor chip, the first and second terminals and, substantially midway between these terminals, a third terminal on the first region along the pn junction being provided, bias current conducting means being connected to the third terminal and means for supplying a control current being connected to the second region. The arrangement described is highly suitable for manufacture in integrated-circuit form, using the techniques generally employed for this purpose.

When the control current is zero the whole elongated pn-junction is blocked and the ac-current between the first and second terminals can necessarily only pass through the first region which preferably has a relatively high resistivity. When increasing the control current an increasing part of the pn-junction in the neighbourhood of the third terminal becomes conducting, thereby allowing the ac-current to flow outside part of the first region. When the ac-current path outside the first region has substantially lower resistivity, the overall ac-resistance between the first and second terminals is reduced by an amount which depends on the magnitude of the control current.

If the resistivity of the second region is not sufficiently low per se, the resistivity of the ac-current path outside the first region may be reduced by the said elongate diode being the emitter-base diode of a transistor, the first region constituting the emitter, the second region constituting the base and a further-region constituting the collector of the transistor.

It is also possible to provide a conductor connected to various locations of the second or of said further region to shunt the intrinsic resistance of such region.

Another possibility to reduce the resistance of the ac-current path outside the first region consists in that the first region has a bent shape such that the distance between the two portions of this region to which the first and second terminals are connected is appreciably shorter than the length of the first region from the first terminal to the second terminal via the third terminal. Such arrangement may be further characterized in that the two portions of the first region to which the first and second terminals are connected are so close to one another that these portions in conjunction with the intermediate portion of the second region form a transistor.

A modification of the arrangement of the invention, providing increased control range, is obtained by splitting up the above-mentioned first region into two substantially equal halves, each of said halves being connected to separate bias current conducting means. The modification so obtained may be characterized by a semiconductor chip comprising substantially equal first and third regions of one conductivity type and a second region of opposite conductivity type, the first and second regions adjoining each other to form a first elongated diode and the second and third region adjoining each other to form a second elongated diode, the first and second terminals being provided on one end of the first and third regions respectively, first and second bias current conducting means being provided on the other ends of the first and third regions respectively and means for supplying control current connected to the second region.

From the French Patent Specification No. 1320027 it is known per se to provide a non-symmetrical electronically variable potentiometer by an elongate transistor arrangement having at one end a variable voltage source connected between base and emitter and at the other end a fixed voltage source connected between collector and emitter.

The abovementioned and further aspects of the invention will now be described more fully with reference to the accompanying diagrammatic drawings, in which.

Figure 1:
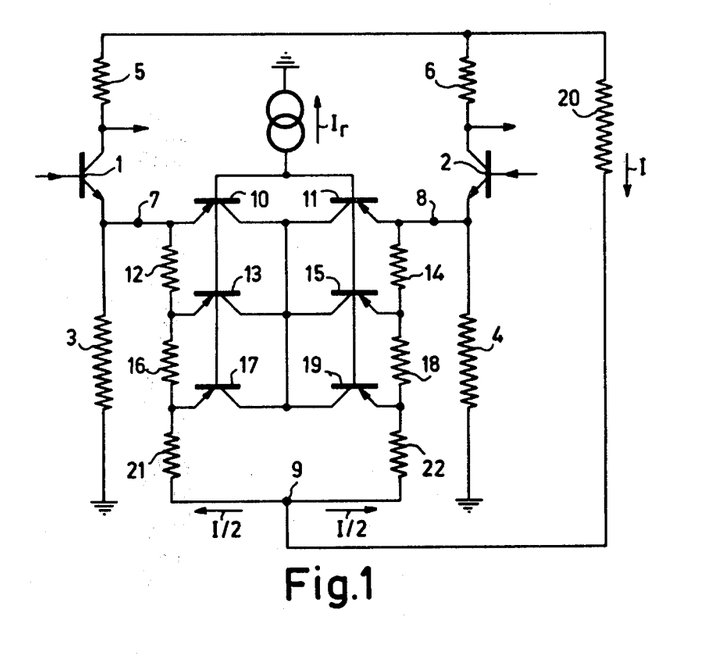
FIG. 1 is a circuit diagram of a first embodiment of an arrangement according to the invention.

FIG. 1 shows an amplifier comprising amplifier transistors 1 and 2 which each have an emitter resistor 3 and 4 respectively and a collector resistor 5 and 6 respectively. The signal to be amplified is applied between the two bases of the transistors 1 and 2, and the amplified signal can be derived between the two collectors. The bases are maintained at equal direct-voltage potentials in a manner not shown. An arrangement having a variable alternating-current resistance according to the invention is included between terminals 7 and 8 connected to the emitters. The circuit between the terminals 7 and 8 comprises two series-connected pn junctions in the form of the emitter-base junctions of two pnp transistors 10 and 11 which are connected in series opposition for the signal current flowing from 7 to 8 and vice versa. A connection 31 between the emitter-base junctions of the transistors 10 and 11 is connected to a device 30 which supplies a control current $I_r$ for controlling the alternating-current resistance between the terminals 7 and 8 and hence for controlling the gain of the entire amplifier. The control current source 30 is symbolically shown in the Figure by means of the current source symbol in order to emphasize that it is a source having a comparatively high impedance, i.e. the internal resistance of the source 30 is high compared with the resistance of the circuit connected to it. Owing to this high internal resistance of the source 30 the signal current which flows between the terminals 7 and 8 cannot flow away to earth via the source 30.

The base-emitter junction of the transistor 10 is shunted by the series combination of a resistor 12 and the emitter-base junction of a transistor 13, and similarly the emitter base junction of the transistor 11 is shunted by the series combination of a resistor 14 and the emitter-base junction of a transistor 15. The emitter-base junction of the transistor 13 is shunted by the series combination of a resistor 16 and the emitter-base junction of a transistor 17, and the emitter-base junction of the transistor 15 is shunted by the series combination of a resistor 18 and the emitter-base junction of a transistor 19. Thus a ladder network of series resistors and parallel pn junctions is produced which if desired may be extended at will. A bias-current source 20 in the form of a resistor connected to the positive supply voltage is connected via a terminal 9 and a resistor 21 to the emitter of the end-transistor 17 of the ladder network, and via the terminal 9 and a resistor 22 to the emitter of the end-transistor 19 of the ladder network. The bias-current source 20 provides a bias current I, one half of which flows through the resistor 21 to the junction point of 16 and 17 and the other half of which flows through the resistor 22 to the junction point of 18 and 19. The collectors of the transistors 10, 11, 13, 15, 17 and 19 are interconnected but otherwise maintained at a floating potential.

To illustrate the operation of the circuit of FIG. 1 it will be assumed that the control current $I_r = 0$. Necessarily all the emitter base junctions of the transistors 10, 11, 13, 15, 17 and 19 will be cut off. Consequently the signal current between the terminals 7 and 8 will flow through the resistors 12, 16, 21, 22, 18, 14. Hence there is a high amount of alternating-current resistance between the terminals 7 and 8 so that the gain of the amplifier stage is small.

The direct currents I/2 flow respectively through the resistors 21, 16 and 12 to the terminal 7 and through the resistors 22, 18 and 14 to the terminal 8. As a result, the emitters of the transistors 13 and 15 are more positive than the emitters of the transistors 10 and 11 and in turn the emitters of the transistors 17 and 19 are more positive than the emitters of the transistors 13 and 15.

If now the control current source 30 starts supplying a small control current $I_r$, the transistors 17 and 19 will become conducting owing to their most positive emitter potentials, whereas the remaining transistors 10, 11, 13 and 15 remain cut off for the time being. The signal current between the terminals 7 and 8 now flows via the elements 12, 16, 17, 19, 18 and 14, which path has an appreciably lower resistance. Hence the coupling between the transistors 1 and 2 and consequently the gain has increased.

With further increase in the control current, first the transistors 13 and 15 and then the transistors 10 and 11 will become conducting. Owing to the gradually decreasing alternating-current resistance in the circuit between the terminals 7 and 8 the gain will progressively increase. Because during the greater part of the control range a considerable part of the alternating-current resistance between the terminals 7 and 8 is constituted by linear resistors which do not give rise to signal distortion, an appreciable reduction of the distortion is obtained.

Figure 2:
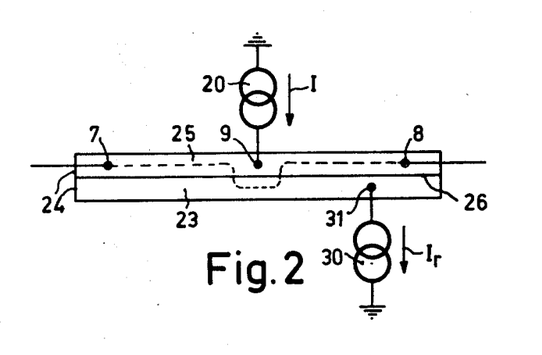
FIG. 2 shows a second embodiment of an arrangement according to the invention.

It should be mentioned that the emitter-base junctions of the transistors 10, 11, 13, 15, 17 and 19 can be replaced by diodes. In a practical embodiment of the circuit arrangement of FIG. 1 the resistors had increasing values, as follows:

resistors 12 and 14: 68 ohms
resistors 16 and 18: 220 ohms
resistors 21 and 22: 680 ohms A considerable simplification of the arrangement according to the invention in particular for use in integrated-circuit form is obtained by taking the following steps which are shown diagrammatically in FIG. 2. The interconnected bases of the transistors of FIG. 1 are combined to form a single n-type region 23 of a semiconductor body 24; the control-current source 30 is connected to this region via the terminal 31. The emitters of the transistors of FIG. 1 and the series resistors of the ladder network are combined to form a single p-type region 25. The terminals 7 and 8 for supplying and deriving the signal current are provided each at an end of the region 25, and the terminal 9 for connection to the bias current source 20 is connected to the centre of the region 25. The discrete emitter-base junctions of the arrangement of FIG. 1 are replaced by the distributed "infinitesimal" pn junctions located along a pn junction 26 between the regions 23 and 25; the intrinsic distributed resistance of the region 25 between the terminals 7 and 9 replaces the discrete resistors 12, 16 and 21 of FIG. 1, and the intrinsic distributed resistance of the region 25 between the terminals 8 and 9 replaces the discrete resistors 14, 18 and 22 of FIG. 1. Initially it will be assumed that the intrinsic resistance of the region 23 is considerably smaller than that of the region 25. If this is not the case, the influence of the intrinsic resistance of the region 23 can be reduced or neutralized by suitable steps, which will be described hereinafter.

If now the control current $I_r$ is zero, the pn junction 26 is blocked throughout its length. The signal current can only flow from the terminal 7 to the terminal 8 and vice versa through the comparatively high-resistance material of the region 25. Hence there is a large and linear alternating-current resistance between the terminals 7 and 8, one half of the bias current I flows from the terminal 9 to the terminal 7, the other half flowing from the terminal 9 to the terminal 8. The voltage drop of this current across the intrinsic resistance of the region 25 causes the region 25 in the vicinity of the terminal 9 to be more positive than in the vicinity of the terminals 7 and 8. If now a comparatively small control current $I_r$ is supplied, only a small part of the pn junction 26 will become conducting, namely the part which is close to the terminal 9, because this portion of the region 25 is most positive. The alternating current then will follow the path indicated by a broken line from the terminal 7 through the left-hand portion of the region 25, then through the central portion of the region 23 and finally through the right-hand portion of the region 25 to the terminal 8. Because this part of the alternating-current path leads through the low-resistance region 23, the alternating-current resistance has become lower. In proportion as the control current is increased a larger part of the signal current path runs through the region 23 so that the alternating-current resistance is correspondingly reduced. If the control current is further increased, the signal current will finally cross immediately from the terminal 7 to the region 23 and return from the region 23 to the region 25 only at the terminal 8.

There are various possibilities of reducing or shunting the intrinsic resistance of the region 23 and they may be used singly or in various combinations.

(1) A first possibility consists in providing a further region (see FIG. 3a, region 27) which adjoins the region 23 and is of the same conductivity type as the region 25 in a manner such that transistor action is produced between the three regions. The part of the signal current which flows from the region 25 (emitter) into the region 23 (base), will cross to the region 27 (collector). If the resistance of the region 27 is sufficiently low, the signal current will find an easy path through this region.

(2) A second possibility is to connect a conductive layer to various locations of the region 23 or of the aforementioned further region to shunt the intrinsic resistance of this region.

(3) A third possibility is to provide a buried layer underneath the region 23, which buried layer is made of a semiconductor material of the same conductivity type as the respective layer but is more heavily doped.

Figure 4A:
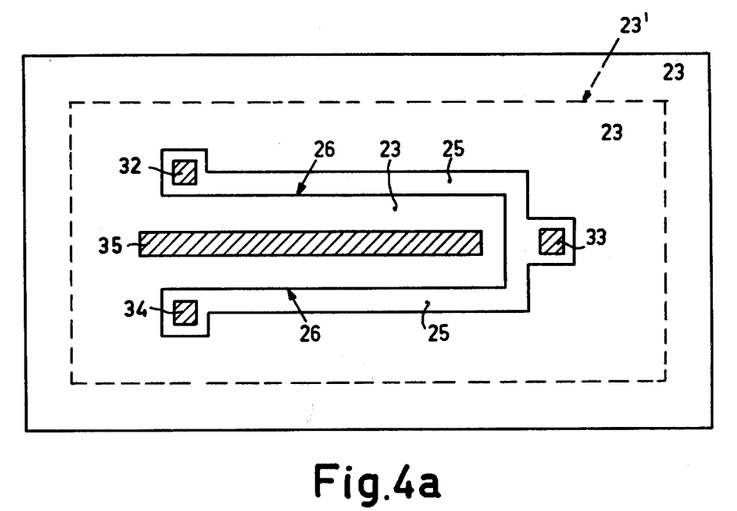
FIGS. 4a and 4b show a second embodiment of a semiconductor device for use in an arrangement according to the invention.
Figure 4B:
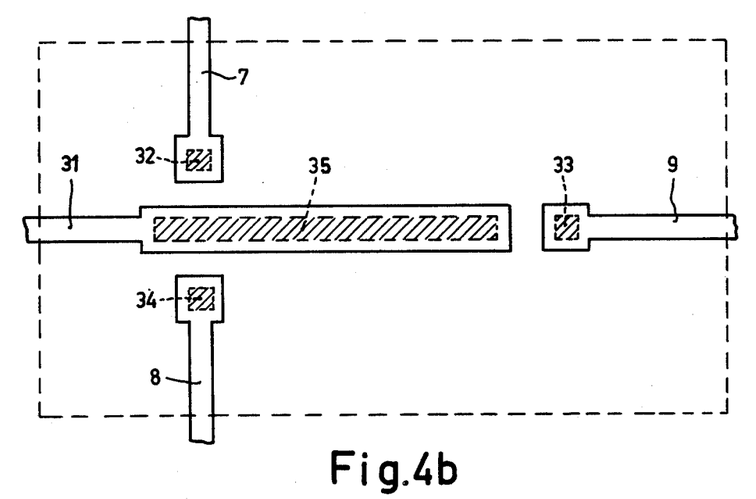

(4) A fourth possibility consists in selecting a suitable geometry of the regions, i.e. a long path length from the terminal 7 to the terminal 8 through the region 25 and a short path length from the terminal 7 to the terminal 8 through the region 23, causing the effective alternating-current resistance of the region 25 to be increased and that of the region 23 to be reduced (see FIGS. 4a and 4b).

Figure 3A:
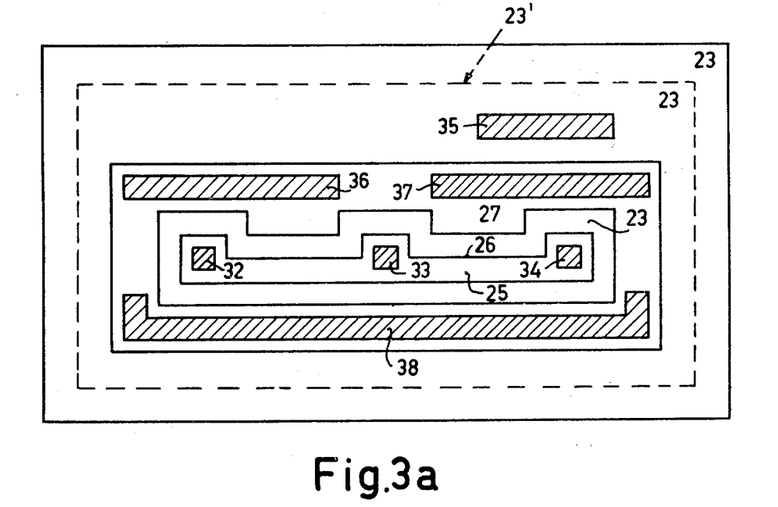
FIGS. 3a and 3b shows an embodiment of a semiconductor device for use in an arrangement according to the invention.
Figure 3B:
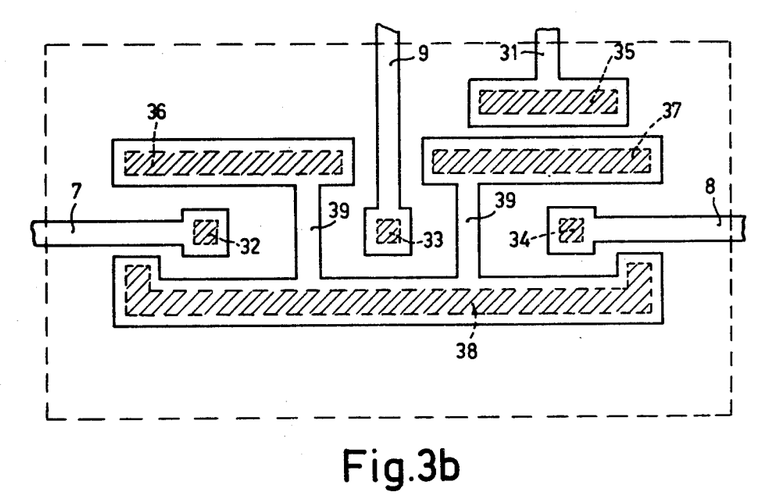

Manufacture of the semiconductor body of FIGS. 3a and 3b starts, in a known manner not described in more detail, from a p-type substrate into which a $n^+$-type buried layer 23' has been diffused. Then an n-type epitaxial surface region 23 is formed on top of the buried layer 23'. Into the region 23 two surface regions 25 and 27 are diffused by means of p-type impurities, the region 25 being of elongate form and being entirely surrounded by the region 27. Thus a lateral pnp transistor is produced having an emitter 25, a base 23 and a collector 27. The assembly is then covered by an insulating layer in which contact openings are made at the locations indicated by shading for providing contacts to the various regions by means of leads. FIG. 3b shows these leads. A first lead, which forms the terminal 7, is connected to an end of the region 25 through a contact opening 32. A second lead, which forms the terminal 8, is connected to the other end of the region 25 through a contact opening 34, and a third lead, which forms the terminal 9, is connected to the centre of the region 25 through a contact opening 33. A lead which forms the terminal 31 is connected through a contact opening 35 to the region 23, and a conductor 39 interconnects all the contact openings 36, 37, 38 through which contact is made to various locations of the region 27. The lead 39 serves to shunt the intrinsic resistance of the region 27 and hence, indirectly and in conjunction with the buried layer 23', the intrinsic resistance of the region 23, so that ultimately at the pn junction 26 along the edge of the region 23 an optimum equipotential plane is produced both for the signal current and for the direct current.

The leads 9 and 31 are connected to a bias current source and a control current source respectively in the manner shown in FIG. 1. These sources may be provided on the same semiconductor chip. The leads 7 and 8 are connected to the signal current circuit, for example to the emitters of two npn transistors 1 and 2 which preferably also are accommodated on the same semiconductor chip. It should be mentioned that the terminals 7 and 8 are dc-connected to the circuit to be controlled, because the difference between the bias current and the control current is conducted away through them. If the dc-current through terminals 7 and 8 has to be kept constant, it is possible to vary the current of source 20 in the same sense as the control current.

Figure 5A:
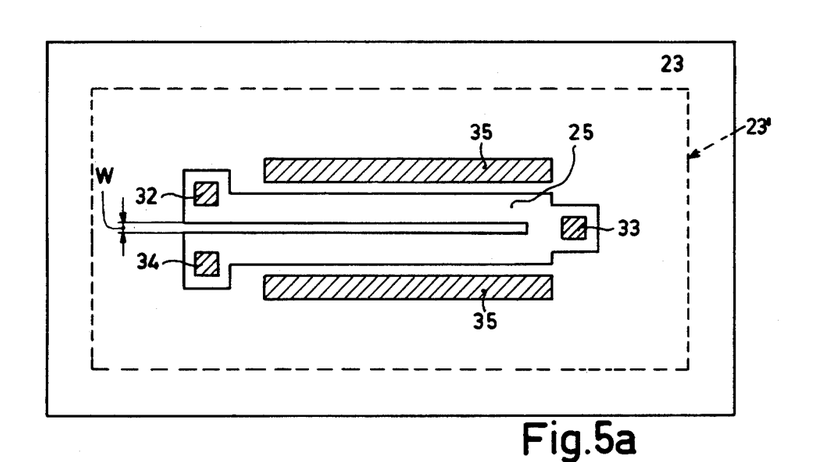
FIGS. 5a and 5b, FIG. 6 and FIGS. 7a and 7b show further embodiments of arrangements or semiconductor elements according to the invention.
Figure 5B:
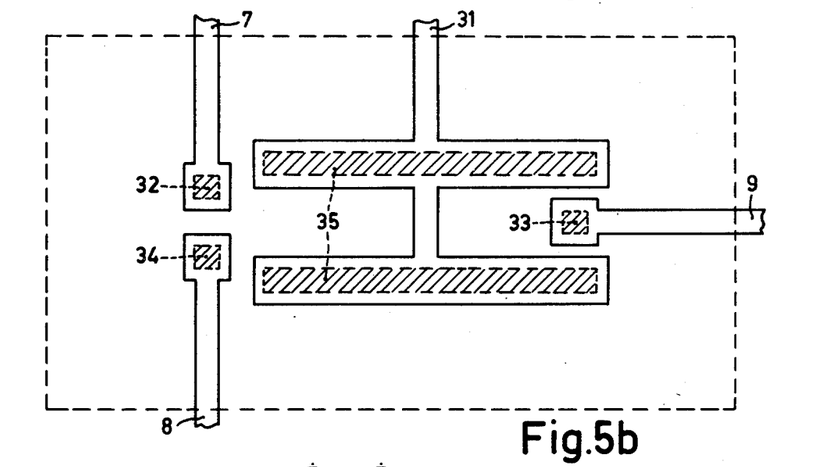

The semiconductor chip of FIGS. 4a and 5b shows the same elements as the chip of FIGS. 3a and 3b, which elements are indicated by the same reference numerals. In this embodiment the region 25 is formed in the shape of a U so that the two ends to which the terminals 7 and 8 are connected through the contact openings 32 and 34 are spaced apart by a comparatively small distance. The path length through the region 23 through which the signal current flows with maximum control current consequently is very short so that the intrinsic resistance of the region 23, which in any case is appreciably reduced by means of the buried layer 23', can no longer play an important part. Hence, a further region, as shown in FIG. 3 at 27, can usually be dispensed with. The lead 31 for supplying the control current through the contact opening 35 to the region 23 preferably extends deep into the horse-shoe shape of the region 25. This enables the control current supplied through the lead 31 to come near to any portion of the pn junction 26 without appreciable resistance. This results in that with a small control current first the portion of the pn junction near the terminal 9 will become conducting whilst the remaining portions will only become conducting with increasing control current.

In the condition of maximum control current supplied through the terminal 31 the signal current follows the shortest path between the terminals 7 and 8 and the resistance of the signal current between these terminals is a minimum. However, in all the embodiments shown this resistance comprises at least twice the differential resistance (of a few tens of ohms) of a pn junction, because the signal current twice passes through the pn junction. A considerable reduction of this resistance is obtainable, however, in that in the configuration of FIG. 4a the two limbs of the U-shaped region 25 are made to approach so closely to one another as to form a transistor in conjunction with the intermediate portion of the region 23 (FIG. 5a). As is well-known for this purpose the width (w) of the region 23 between the two limbs of the region 25 must be smaller than the diffusion length of the minority carriers in the region 23. Since in this case there is no longer room between the said two limbs for contacting to the region 23, the contact openings 35 are disposed externally of the U-shaped region 25. FIG. 5b shows the contact openings of FIG. 5a with the conductive strips for the electric connections provided thereon.

When maximum control current is supplied through the terminal 31, the portion of the p region 25 in close proximity to the contact opening 32 and the portion of the p region 25 in close proximity of the contact opening 34 in conjunction with the narrow intermediate portion of the n region 23 constitute a lateral pnp transistor in the saturated condition. As is known, such a transistor constitutes only a very small alternating-current resistance (of a few ohms) between the collector and the emitter (the terminals 7 and 8).

Figure 6:
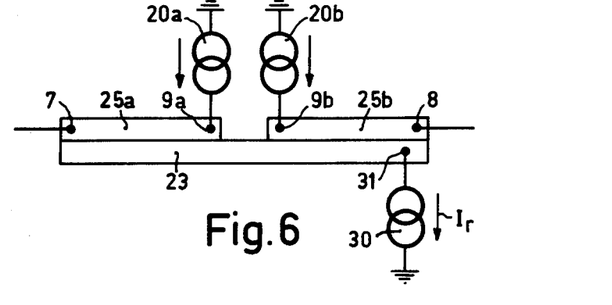

The embodiments shown may be modified in various manners. For example, in the embodiment shown in FIG. 1 the current source 20, which is connected to the ladder network of diodes and resistors through two resistors 21 and 22, may be replaced by two separate current sources, for example two large resistors. In this case, in the non-controlled condition the alternating-current resistance between the terminals 7 and 8 is very high, resulting in an increased control range which however, generally is at the expense of the signal handling. If the circuit including the semiconductor of FIG. 2 is modified according to this principle, FIG. 6 is obtained. The region 25 is interrupted at the centre so that two equal partial regions 25a and 25b are formed, two current sources 20a and 20b being connected by terminals 9a and 9b respectively, one on either side of the interruption, to the two partial regions 25a and 25b respectively.

Figure 7A:
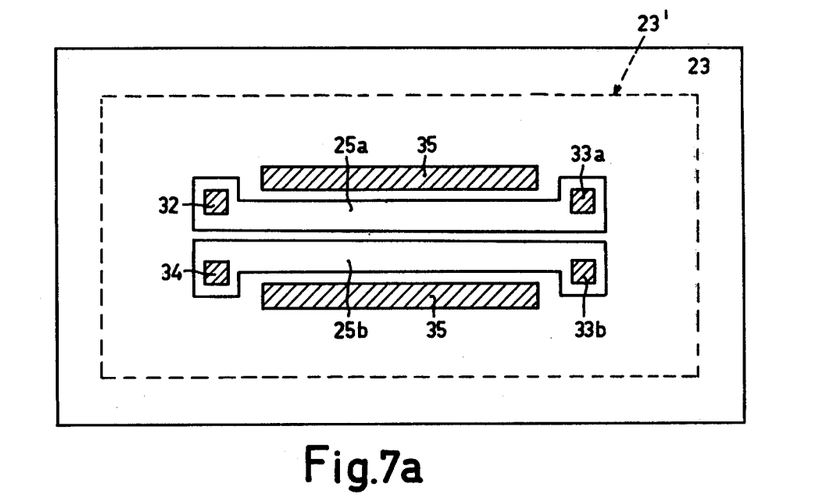
Figure 7B:
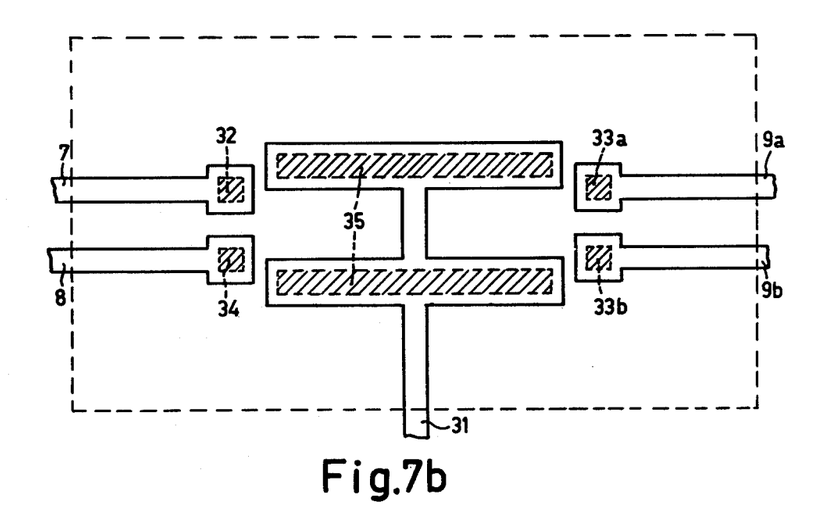

FIGS. 7a and 7b, in which corresponding reference numerals are used, show an embodiment obtained by applying the principle of the interrupted region 25 to the embodiments of FIGS. 5a and 5b. An elongate lateral pnp transistor is obtained in which both the two ends of the collector region 25a and the two ends of the emitter region 25b are provided with terminals (7, 9a and 8, 9b respectively). The terminals 7 and 8 serve for connection to the circuit to be controlled whilst the terminals 9a and 9b serve for connection to the current sources 20a and 20b respectively.

In the arrangement of FIG. 1 the diodes 10, 11, 13, 15, 17 and 19 may have their polarities reversed if the directions of the currents I and I, are also reversed. Similarly, in FIGS. 2 to 7 the conductivity types of the various regions may be interchanged if also the polarities of the control current and of the bias current are reversed.

What is claimed is:

1. A symmetrical circuit arrangement for forming a variable alternating-current resistance between a first and a second terminal comprising:
   (a) two interconnected first p,n junctions connected in series between said first and second terminals and so that said first junctions are opposed to the pass direction of current flow between said first and second terminals;
   (b) means for supplying a control current to the interconnection of said first p,n junctions, said first p,n junctions being connected in the pass direction as to the control current;
   (c) a number of series combinations each comprising a resistor and a second p,n junction connected in the same pass direction as to said control current and shunting each of said first p,n junctions, each of said resistors being connected to respective said second p,n junctions at respective connections;
   (d) bias current conducting means connected to said respective connections of said combinations of said resistor and second p,n junction; and
   (e) means for providing said bias current.

2. A circuit arrangement as in claim 1, wherein said bias current conducting means each comprise a further series combination of a second resistor and a third p,n junction having the same pass direction as said second p,n junction, which further series combinations each shunt a said second p,n junction, and further comprising bias current conducting means connected to each said connection of second resistor and third p,n junction.

3. A circuit arrangement as in claim 1, wherein said p,n junctions contain respective base-emitter junctions of transistors, said transistors further containing collectors which are interconnected, said transistor bases being connected to one another and to said means for supplying a control current.

4. A symmetrical circuit arrangement device for forming a variable alternating-current resistance between a first and a second terminal, comprising:
   (a) a semiconductor body including first and second regions of opposite conductivity types and forming an elongated p,n junction therebetween to provide a diode;
   (b) said first and second terminals disposed at said first region of said semiconductor body;
   (c) a third terminal being located on said first region along said p,n junction and substantially midway between said first and second terminals;

(d) a bias current source and means for conducting the current of said bias current source through said third terminal to said first region; and (e) a control current source connected to said second region, the controllable current of said control current source having a polarity to pass the pn-junction between said first and second regions.

5. A device as in claim 4, wherein said body further includes a third region constituting a collector of a transistor formed by said first, second, and third regions and said diode is the emitter-base diode of said transistor, said first region constituting the emitter and said second region constituting the base.

6. A device as in claim 5, further comprising a conductor element connected to various locations of said third region to shunt the intrinsic resistance of said second region.

7. A device as in claim 4, further comprising a conductor connected to various locations of said second region to shunt the intrinsic resistance of said second region.

8. A device as in claim 4, wherein said first region comprises respective portions to which said first and second terminals are connected and has a bent shape such that the distance between said two portions is appreciably shorter than the length of the path in said first region from said first terminal to said second terminal via said third terminal.

9. A device as in claim 8, wherein said two portions of the first region are located sufficiently close to one another so that said two portions form a transistor in conjunction with that portion of said second region intermediate thereto.

10. A device as in claim 4, wherein said body comprises first and second emitter-coupled transistor-stages and said first and second terminals are respectively connected to the emitter electrodes of said first and second transistor stages.

11. A symmetrical arrangement for forming a variable alternating-current resistance between a first and a second terminal, comprising a semiconductor body comprising substantially equal first and third regions of one conductivity type and a second region of opposite conductivity type, said first and second regions adjoining each other to form a first elongated diode and said second and third regions adjoining each other to form a second elongated diode, said first and second terminals being provided on first ends of said first and third regions, respectively, first and second bias current conducting means provided on other ends of said first and third regions, respectively, and means for supplying control current, said supplying means being connected to said second region.

* * * * *